United States Patent [19]

Stevenson

[11] 4,173,767
[45] Nov. 6, 1979

[54] CMOS MONOLITHIC INTEGRATED CIRCUIT

[75] Inventor: Alastair K. Stevenson, Glenrothes, Scotland

[73] Assignee: Hughes Aircraft Company, Culver City, Calif.

[21] Appl. No.: 903,360

[22] Filed: May 5, 1978

[30] Foreign Application Priority Data

Jun. 1, 1977 [GB] United Kingdom ............... 23248/77

[51] Int. Cl.² .............................................. H01L 27/02
[52] U.S. Cl. ....................................... 357/44; 357/23; 357/41; 357/48
[58] Field of Search .................... 357/23, 41, 44, 48

[56] References Cited

U.S. PATENT DOCUMENTS

| 3,641,511 | 2/1972 | Cricchi et al. | 357/41 |
| 3,959,812 | 5/1976 | Imaizumi | 357/48 |
| 3,967,295 | 6/1976 | Stewart | 357/41 |

Primary Examiner—Edward J. Wojciechowicz
Attorney, Agent, or Firm—R. M. Wallace; W. H. MacAllister

[57] ABSTRACT

The invention concerns CMOS integrated circuits including an arrangement to prevent regenerative bipolar current flow between complementary transistors in the circuit.

In one particular form, the invention provides a CMOS inverter comprising an N-type substrate in which is formed a P-channel MOS transistor together with a P-type well having therein an N channel MOS transistor, the drain of the P-channel transistor being connected to the drain of the N-channel transistor, and there being disposed in the N-type substrate between the said transistors, a P-type region preferably extending to the depth of said P-type well and electrically connected to the source of the N-channel transistor. The effect of the P-type region aforesaid is to preclude the likelihood of regenerative bipolar conduction becoming established, in use of the inverter, in the substrate, which bipolar conduction might otherwise cause destruction of the CMOS circuit.

13 Claims, 5 Drawing Figures

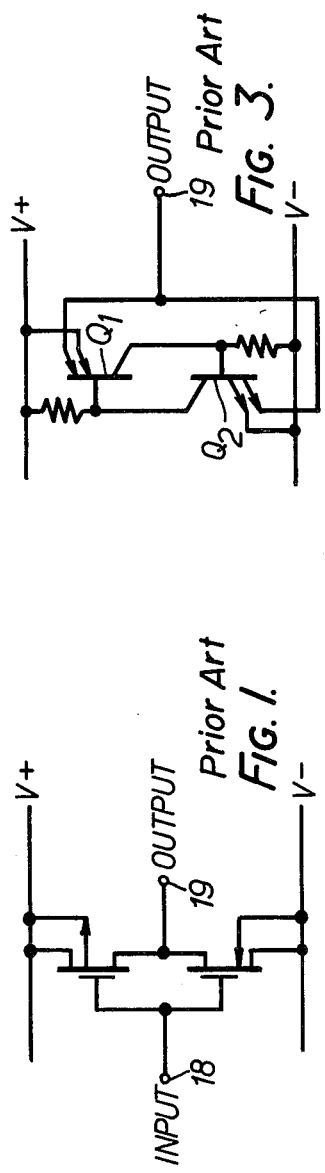
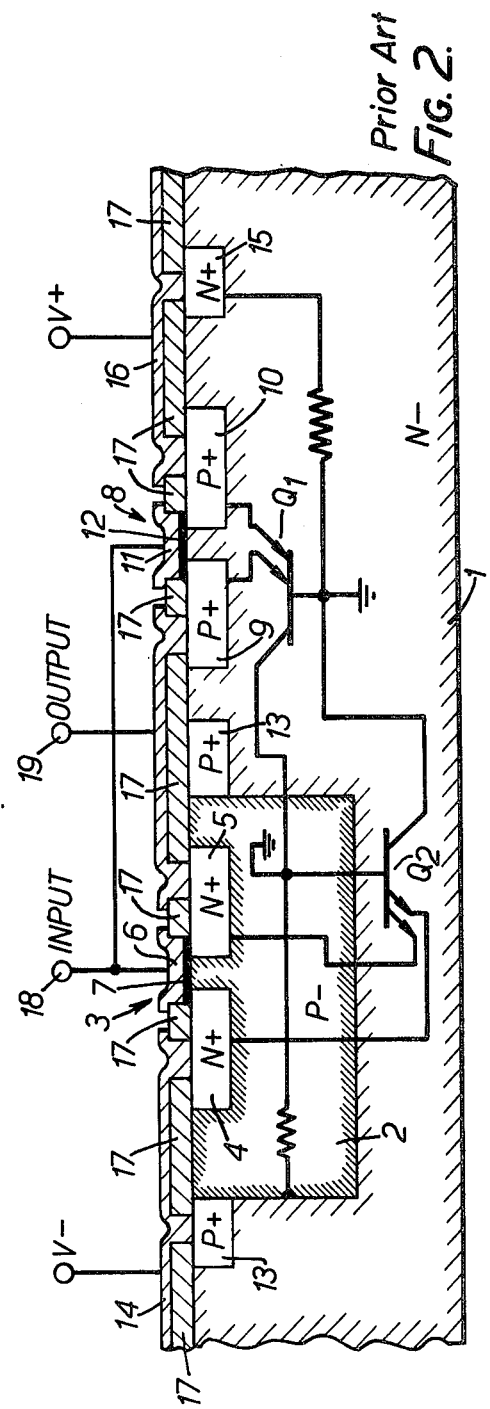

4,173,767

CMOS MONOLITHIC INTEGRATED CIRCUIT

FIELD OF THE INVENTION

This invention relates to complementary metal oxide semiconductor (CMOS) integrated circuits.

BACKGROUND OF THE INVENTION

Monolithic CMOS integrated circuits are well known and comprise a plurality of N-channel and P-channel MOS transistors formed in a common silicon substrate. An extremely high transistor packing density has been achieved in CMOS circuits and typically 25,000 transistors are formed on a chip less than 1 cm$^2$. The transistors are formed by doping regions of two different conductivity types in the substrate. Usually the substrate is doped to be of N-type conductivity, the P-channel transistors being formed in the surface of the substrate and the N-channel transistors being formed in one or more P-type wells doped into the N-type substrate. The transistors are interconnected by metallisation layers so as to define well known inverters and transmission gates or other circuit arrangements.

A difficulty with CMOS circuits is that unwanted electrical conduction can occur between adjacent transistors as a consequence of the aforementioned high transistor packing density. Now, as is well known, the N-channel and P-channel transistors operate by unipolar conduction, and to prevent unipolar conduction between adjacent N and P-channel transistor locations, heavily doped guard bands are usually formed around the transistors. Also, in certain operating conditions of the circuit, an unwanted bipolar conduction can occur between the various aforementioned N and P type regions associated with an adjacent N and P channel transistor, the bipolar conduction establishing a regenerative current flow between the transistors which build up uncontrollably and which can damage the circuit. The unwanted bipolar conduction can for example become established by an input voltage to the circuit spuriously being contaminated by voltage spike which causes the input voltage to attain a transient value outside of its normal operating range, the resulting bipolar conduction establishing a regenerative current flow which rapidly and uncontrollably builds up to a maximum value determined by the supply capacity of the circuit's power supply, thereby injecting into the transistors heavy currents which can destroy the circuit. To prevent such damage to the circuit, the known CMOS circuits have been provided with voltage limiting circuits that limit the input voltages to a predetermined range in which the aforementioned bi-polar conduction does not occur, but the known voltage limiting circuits have the disadvantage of being undesirably complex and of taking up space in the circuit that would be useful for other purposes.

SUMMARY OF THE INVENTION

It is an object of the invention to provide a monolithic CMOS integrated circuit with an improved means for inhibiting the potentially destructive effects of the aforementioned bipolar conduction between adjacent complementary transistors.

It is another object of the invention to overcome the requirement for the known complex voltage limiting circuits.

These objects and others are accomplished in accordance with the present invention by providing between adjacent complementary transistors in a CMOS integrated circuit, a region of semiconductor material which inhibits bipolar conduction in the substrate between the transistors.

More particularly, the present invention provides a monolithic CMOS integrated circuit including a substrate of semiconductor material of a first conductivity type, a well of semiconductor material of a second conductivity type formed in the substrate, a first MOS transistor having source and drain regions of said first conductivity type formed in said well, a second MOS transistor having source and drain regions of said second conductivity type formed in the substrate externally of said well, and a further region of said second conductivity type formed in the substrate between said transistors, said further region being so arranged as to inhibit any bipolar conduction which would otherwise establish a regenerative current flow in the substrate between the transistors in use thereof.

The present invention has the advantage of providing a simple way of overcoming the aforementioned problems associated with bipolar conduction between the transistors without unduly complicating the circuit with ancillary limiting circuits as in the prior art, thereby simplifying the photomasks used in manufacture of the circuit and thereby permitting an improved transistor packing density and/or improving the likelihood of satisfactory manufacturing yields.

In one particular form, which will be described in detail hereinafter, the present invention provides a CMOS inverter comprising an N-type substrate in which is formed a P-channel MOS transistor together with a P-type well having therein an N-channel MOS transistor, the drain of the P-channel transistor being connected to the drain of the N-channel transistor, and there being disposed in the N-type substrate between the said transistors, a P-type region preferably extending to the depth of said P-type well and electrically connected to the source of the N-channel transistor. The effect of the P-type region aforesaid is to preclude the likelihood of regenerative bipolar conduction becoming established, in use of the inverter, in the substrate, which bipolar conduction might otherwise cause destruction of the CMOS circuit.

BRIEF DESCRIPTION OF THE DRAWINGS

In order that the invention may be more fully understood and readily carried into effect, an embodiment thereof will now be described by way of illustrative example and by way of contrast with an example of a prior art CMOS integrated circuit, reference being had to the accompanying drawings in which:

FIG. 1 is a schematic circuit diagram of a known CMOS inverter;

FIG. 2 illustrates schematically in cross section a silicon chip incorporating the circuit of FIG. 1, and also illustrates schematically parasitic bipolar transistors inherently formed in the chip as a result of the particular construction of the CMOS circuit;

FIG. 3 is a schematic circuit diagram of the parasitic bipolar transistor of FIG. 2;

DESCRIPTION OF PREFERRED EMBODIMENT

Figure 4:
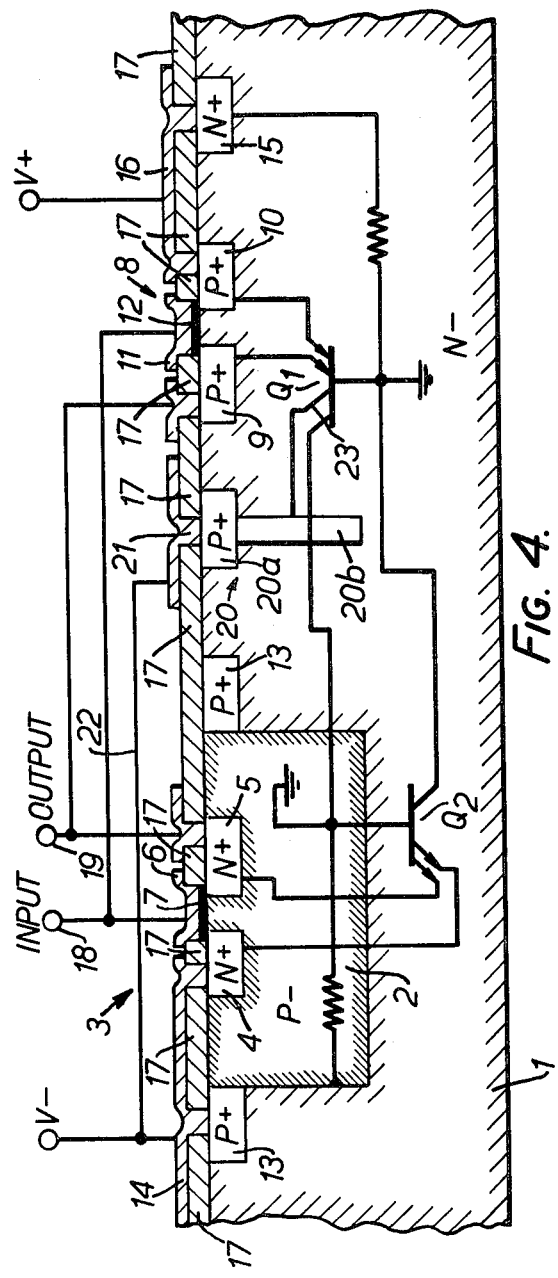
FIG. 4 illustrates schematically in cross section a silicon chip incorporating a CMOS inverter circuit in accordance with the present invention.

Referring firstly to FIGS. 1 and 2, there is shown a known CMOS inverter which comprises an N-type substrate 1 impregnated with a P-type well 2. In the well 2 is formed an N-channel transistor 3 having an N-type source channel 4, an N-type drain channel 5, a gate electrode 6 and an oxide layer 7. Also, there is formed in the surface of the substrate 1 a P-channel transistor 8 which comprises a P-type drain channel 9 connected to the drain 5 of the N-channel transistor by a metallised surface layer, a P-type source 10, a gate electrode 11 and an oxide layer 12.

Surrounding the P-type well is a heavily doped P-type guard ring 13 which is connected by a metallised surface layer 14 to the source 4 of the N-channel transistor 3. A heavily doped N-type guard channel 15 is formed in the substrate adjacent the P-channel transistor 8, the channel 15 being connected to the source of the transistor 8 by a metallic surface layer 16. An appropriately formed Si O₂ layer 17 provides electrical insulation between the various channels and their metallised electrical connections.

In use of the device symmetrical electrical potentials of opposite polarities (+V and −V) are applied from a power supply (not shown) to the sources of the transistors 3 and 8 respectively, an input potential is applied to the gates of the transistors 3 and 8 on a line 18 and an output is taken from the metallised connection between the channels 5 and 9 of the transistors on an output line 19.

The complementary MOS transistors 3 and 8 operate as an inverter by unipolar conduction, as is well known. However, in use, the presence of the various N and P-type regions of the device, promotes bipolar conduction within the substrate. This bipolar conduction can be described and quantified with some accuracy by considering the P and N type regions to promote two parasitic bipolar transistors Q1 and Q2 connected together as shown in FIGS. 2 and 3. The parasitic transistor Q1 is of PNP type and is formed by the N-type substrate 1 which provides the base, the P-type channels 9 and 10 which provide two emitters for the transistor, and the P-type well 2 which provides the collector. The parasitic transistor Q2 is of NPN-type and has two emitters provided by the N-type channels 4 and 5, a base provided by the P-type well 2 and a collector provided by the N-type substrate 1. The base of transistor Q1 is connected to the +V supply through a resistance provided by the N-type guard channel 15 and the base of transistor Q2 is connected to the −V supply through a resistance constituted by the P-type guard ring 13. The base of transistor Q1 is connected to the collector of transistor Q2 and vice versa. The gains of the parasitic transistors Q1 and Q2 and the values of the resistances concerned will depend on the diffusion resistances and the circuit layout. However, in a typical example, the current gain of transistor Q1 is approximately unity and the current gain of transistor Q2 is several hundred. Thus, the product of the current gains of the transistors is much greater than unity and thus the transistors Q1 and Q2 are connected together in a regenerative loop which can be triggered into operation upon appropriate operating potentials being applied to the CMOS circuit.

In the event that there is applied to the input 18 a spurious voltage spike that is of a magnitude greater than that of the rail voltages ±V, the regenerative loop is triggered into operation, a condition hereinafter referred to as "latch-up", and the transistors Q1, Q2 continuously inject a heavy current into the P and N channels of the transistors 3 and 8, the current being limited only by that available from the power supply. The heavy injected current can cause breakdown of the MOS transistors 3, 8.

A monolithic integrated CMOS inverter circuit in accordance with the invention will now be described with reference to FIGS. 4 and 5, in which latch-up of a regenerative loop between the transistors Q1 and Q2, is prevented.

Figure 5:
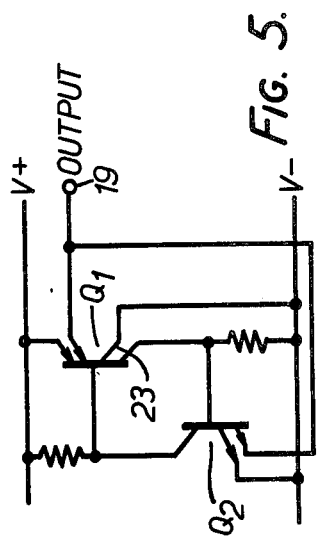
FIG. 5 illustrates the parasitic bipolar transistors associated with the CMOS circuit of FIG. 4.

The construction of the integrated circuit of FIG. 5 is similar to that of FIG. 2 and like parts are marked with like reference numerals. The circuit of FIG. 5 however, includes a further P-type region 20 between the complementary MOS transistors 3 and 8. The further region 20 comprises a heavily doped P-type channel portion 20a in the surface of the N-type substrate 1, and a lightly doped deep P-type channel portion 20b which extends into the substrate to approximately the depth of the P-type well 2. A metallised surface layer electrode 21 is connected to the P-type channel 20a, the electrode being connected to the negative supply rail, the connection being shown schematically by a lead 22 for clarity although in practice the connection will be made by a metal electrode layer.

The presence of the P-type region 20 effects the configuration of the parasitic bipolar transistors Q1, Q2 which describe the bipolar conduction within the substrate. The configuration of the parasitic transistors is shown in FIGS. 4 and 5, and it will be seen that the region 20 provides the transistor Q1 with a further collector 23 which is connected directly to the negative (−V) supply line, with the result that only a small proportion of the collector current of transistor Q1 passes to the base of the transistor Q2, most of the collector current of Q1 flowing directly to the negative supply line through the collector 23. Consequently, the current gain around the loop defined by the parasitic transistors Q1, Q2 is less than unity so that when the transistors Q1, Q2 are activated, a regeneration current will not build up to an unlimited value but will attain a level determined by the forward bias of the output line 19 with respect to the supply voltage V. Thus, latch-up is prevented and the CMOS circuit will handle safely input potentials ranging fully between and exceeding the potentials of the supply (+V and −V) without a condition occurring which is potentially destructive for the circuit.

Clearly, many modifications to the above described arrangement are possible without departing from the scope of the present invention, and for example the substrate 1 could be of P-type material in which case all of the P-type regions of FIG. 4 would be replaced by N-type regions and vice versa. Many other modifications and variations of the above described circuit of the invention will be apparent to those skilled in the art, and whilst the described example of the invention is an inverter, it will be appreciated that the principle of the invention may be utilised to prevent bipolar conduction in for example transmission gates and also in other circuit arrangements in which N-channel and P-channel transistors are disposed adjacent one another on a common substrate.

It will be appreciated that the circuit arrangement shown in FIG. 4 represents only one small portion of the integrated circuit which will in fact include many more complementary MOS transistors. However, channels such as 20 need not necessarily be included between all adjacent complementary transistors in the circuit, and preferably channels such as 20 are only included between complementary transistors that constitute input or output stages of the circuit since it is only these transistors which will be subject to spurious voltage fluctuations which could trigger a bipolar conductive latch up in the circuit.

I claim:

1. A complementary Metal Oxide Semi Conductor (MOS) transistor device formed on a monolithic substrate having a first region of a first conductivity type and an adjacent second region of a second conductivity type, one of said regions comprising a well in said substrate and surrounded by the other of said regions, comprising:
   a first MOS transistor in said first region, said first transistor comprising a first source and drain of said second conductivity type;
   a second MOS transistor in said second region, said second transistor comprising a second source and drain of said first conductivity type;
   a first parasitic bipolar transistor having a base, an emitter and a collector, each respectively comprising said first region, at least one of said first source and drain, and said second region;
   a second parasitic bipolar transistor having a base, an emitter and a collector, each respectively comprising said second region, at least one of said second source and drain, and said first region; and
   collector means reducing parasitic current gain between said first and second parasitic transistors, said collector means having an additional collector diffusion disposed in one of said first and second regions, said additional collector diffusion separated from the other of said regions by a portion of said one region, said additional collector diffusion having a conductivity type of opposite polarity from the conductivity type of said one region.

2. The device of claim 1 wherein said collector means comprises an additional collector in one of said first and second parasitic transistors, said collector means collecting a substantial portion of the collector current in said one parasitic transistor, preventing said portion of current from flowing to the base of the other of said parasitic transistors.

3. The device of claim 1 wherein said collector means is connected to a bias voltage source.

4. The device of claim 1 wherein: said first type of conductivity is N-type and said second type of conductivity is P-type;
   said substrate is of N-type conductivity defining said first region and said second region is a P-type well in said substrate; and
   said collector means comprises a P-type diffusion portion disposed in said N-type region and separated from said P-type region by a portion of said N-type region.

5. The device of claim 4 wherein said collector means is connected to a negative bias voltage supply.

6. The device of claim 5 wherein said bias voltage supply is connected to said second source.

7. The device of claim 4 wherein said P-type portion of said collector means is diffused to to a depth approximately equal to the depth of said well.

8. The device of claim 4 further comprising guard rings contacting the periphery of said well having the same conductivity type as said well and having an impurity concentration greater than the impurity concentration of said well.

9. The device of claim 1 wherein said first parasitic transistor has a first gain and said second parasitic transistor has a second gain, said second gain greater than said first gain, and wherein said collector means is disposed in said first region.

10. The device of claim 9 wherein said first gain is approximately unity and said second gain is at least 100.

11. A complementary Metal Oxide Semi Conductor (MOS) device having reduced parasitic bipolar gain, comprising:
    a first region of a first conductivity type;
    a second region of a second conductivity type adjoining said first region;
    a first MOS transistor in said first region having a first source and drain of said second conductivity type;
    a second MOS transistor in said second region having a second source and drain of said first conductivity type;
    a first parasitic bipolar transistor having a base, an emitter and a collector, each comprising respectively said first region, at least one of said first source and drain, and said second region;
    a second parasitic bipolar transistor having a base, an emitter and a collector, each comprising respectively said second region, at least one of said second source and drain, and said first region; and
    additional collector means in at least one of said first and second regions having an opposite conductivity type from said one region and separated from the other of said regions by a portion of said one region, said additional collector means preventing a substantial portion of the collector current in one of said first and second parasitic transistors from entering the base of the other of said parasitic transistors.

12. The device of claim 11, wherein:
    said first type of conductivity is N-type;
    said second type of conductivity is P-type;
    said first parasitic transistor has a first gain;
    said second parasitic transistor has a second gain greater than said first gain; and
    said additional collector means comprises an additional P-type diffusion area in said first region separated by a portion of said first region from said second region.

13. The device of claim 12 wherein said additional collector means is connected to a negative voltage source, said additional collector means collecting a substantial amount of collector current of said first parasitic transistor, diverting said current from the base of said second parasitic transistor, said additional collector means limiting the gain of bipolar current flow in said device so as not to substantially exceed said first gain.

* * * * *